(12) United States Patent
Lin et al.

(10) Patent No.: US 7,307,009 B2
(45) Date of Patent: Dec. 11, 2007

(54) PHOSPHORIC ACID FREE PROCESS FOR POLYSILICON GATE DEFINITION

(75) Inventors: Li-Te S. Lin, Hsin-Chu (TW);
Fang-Cheng Chen, Hsin-Chu (TW);
Huin-Jer Lin, Hsin-Chu (TW);
Yuan-Hung Chiu, Taipei (TW);
Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 340 days.

(21) Appl. No.: 10/999,270

(22) Filed: Nov. 29, 2004

(65) Prior Publication Data

US 2005/0118755 A1 Jun. 2, 2005

Related U.S. Application Data

(63) Continuation of application No. 10/718,876, filed on Nov. 21, 2003, now Pat. No. 6,849,531.

(51) Int. Cl.
*H01L 21/00* (2006.01)

(52) U.S. Cl. ............ 438/585; 438/197; 438/592

(58) Field of Classification Search ............ 438/585, 438/592, 197
See application file for complete search history.

(56) References Cited

U.S. PATENT DOCUMENTS

| | | | |
|---|---|---|---|
| 5,612,249 A | 3/1997 | Sun et al. | |
| 6,204,161 B1 * | 3/2001 | Chung et al. | 438/612 |
| 6,222,241 B1 * | 4/2001 | Plat | 257/437 |
| 6,232,209 B1 | 5/2001 | Fujiwara et al. | |
| 6,251,719 B1 | 6/2001 | Wang | |
| 6,283,131 B1 | 9/2001 | Chen et al. | |
| 6,403,432 B1 | 6/2002 | Yu et al. | |
| 6,420,280 B2 * | 7/2002 | Plat | 438/786 |
| 6,524,938 B1 | 2/2003 | Tao et al. | |
| 6,531,350 B2 | 3/2003 | Satoh et al. | |
| 6,579,809 B1 | 6/2003 | Yang et al. | |
| 6,664,604 B1 | 12/2003 | Besser et al. | |
| 6,693,313 B2 | 2/2004 | Gonzalez et al. | |
| 6,764,903 B1 * | 7/2004 | Chan et al. | 438/257 |
| 6,849,531 B1 * | 2/2005 | Lin et al. | 438/585 |
| 2001/0010976 A1 * | 8/2001 | Plat | 438/786 |
| 2002/0076931 A1 * | 6/2002 | Plat et al. | 438/689 |
| 2005/0118755 A1 * | 6/2005 | Lin et al. | 438/197 |
| 2006/0115949 A1 * | 6/2006 | Zhang et al. | 438/300 |

* cited by examiner

*Primary Examiner*—Laura M. Schillinger
(74) *Attorney, Agent, or Firm*—Haynes and Boone, LLP

(57) ABSTRACT

A method of defining a patterned, conductive gate structure for a MOSFET device on a semiconductor substrate includes forming a conductive layer over the semiconductor substrate and forming a capping insulator layer over the conductive layer. An anti-reflective coating (ARC) layer is formed over the capping insulator layer and a patterned photoresist shape is formed on the ARC layer. A first etch procedure using the photoresist shape as an etch mask defines a stack comprised of an ARC shape and a capping insulator shape. A second etch procedure using the stack as an etch mask defines the patterned, conductive gate structure in the conductive layer.

13 Claims, 3 Drawing Sheets

PHOSPHORIC ACID FREE PROCESS FOR POLYSILICON GATE DEFINITION

CROSS REFERENCE

This application is a continuation of U.S. patent application Ser. No. 10/718,876 filed Nov. 21, 2003 now U.S. Pat. No. 6,849,531, and entitled, "Phosphoric Acid Free Process for Polysilicon Gate Definition," which is hereby incorporated by reference in its entirety.

BACKGROUND

The present invention relates to methods used to fabricate semiconductor devices, and in some embodiments, to a method used to define a polysilicon gate structure for a metal oxide semiconductor field effect transistor (MOSFET) device.

Micro-miniaturization, or the ability to fabricate semiconductor devices with sub-micron features, has allowed the performance of the sub-micron device to be increased while the fabrication cost of the same sub-micron semiconductor device has been decreased. The smaller device features result in decreases in performance degrading parasitic capacitances in addition to allowing a greater number of smaller semiconductor chips, still comprised with device densities comparable to larger semiconductor chips, to be obtained from a specific size starting wafer thus reducing the process cost of each individual semiconductor chip. One critical dimension of sub-micron semiconductor or MOSFET devices, is the width of the conductive gate structure, or the channel length of the MOSFET device. This dimension is critical in determining MOSFET device performance. Conductive gate structures defined in polysilicon layers via photoresist masking and dry etching procedures, have been used to define narrow width conductive gate structures. However to control this critical dimension, anti-reflective coatings (ARC) layers are employed underlying the masking photoresist shape to optimize photoresist exposure and thus optimize the definition of the polysilicon gate structure using the narrow photoresist shape as an etch mask. To further insure critical dimension control of the masking photoresist shape, a dual ARC strategy is used. The dual ARC technology comprises a bottom anti-reflective coating (BARC) layer underlying the pre-exposed photoresist layer and a dielectric anti-reflective coating (DARC) layer underlying the BARC layer, with the DARC layer sometimes comprised of silicon nitride or silicon oxynitride. After definition of the conductive gate structure removal of the DARC layer is accomplished using a hot phosphoric acid solution capitalizing on the high selectivity between the fast etching silicon nitride or silicon oxynitride DARC layer and underlying non-silicon oxide materials. However the hot phosphoric wet etch tanks if not frequently maintained can be loaded with unwanted particles as a result of previous applications. After DARC removal, particles from the contaminated hot phosphoric acid wet etch tank can deposit on critical regions of the in-process MOSFET device resulting in yield loss.

The present disclosure will describe a procedure for defining a MOSFET device conductive gate structure, wherein a dual ARC technology is used. However, several embodiments of the present invention will include removal of a DARC layer without employment of hot phosphoric acid, thus avoiding the contamination and possible yield detractors resulting from unwanted particles in the hot phosphoric acid.

BRIEF DESCRIPTION OF THE DRAWINGS

The object and other advantages of this invention are best described in the preferred embodiments with reference to the attached drawings that include.

DETAILED DESCRIPTION

A method of defining a polysilicon gate structure for a MOSFET device wherein a dual ARC coating is employed as a component of the defining photolithographic procedure, and wherein the dual ARC coating is removed without the use of hot phosphoric acid, will now be described in detail. Semiconductor substrate 1, comprised of P type single crystalline silicon featuring a <100> crystallographic orientation, is used and schematically shown in FIG. 1. Gate insulator 2, comprised of a gate dielectric layer such as thermally grown silicon oxide, silicon oxynitride, nitrogen doped silicon oxide or a high dielectric constant (high k) layer, is formed to a thickness between about 6 to 80 Angstroms on semiconductor substrate 1. The silicon dioxide or nitrogen doped silicon oxide gate dielectric candidates are formed at a thickness between about 6 to 20 Angstroms, while silicon oxynitride or other high k gate dielectric alternatives are formed to a thickness between about 20 to 80 Angstroms.

Conductive layer 3, a layer such as polysilicon, is next formed to a thickness between about 400 to 1800 Angstroms. The polysilicon layer can be in situ doped during deposition via the addition of arsine or phosphine to a silane or disilane ambient, or the polysilicon layer can be deposited intrinsically then implanted with arsenic or phosphorous ions. If desired, a metal silicide layer such as tungsten silicide, cobalt silicide, or nickel silicide, can be used as conductive layer 3. Silicon oxide layer 4 is next formed, to be used as a capping oxide layer for the subsequent polysilicon gate definition procedure. Capping silicon oxide layer 4 is obtained at a thickness between about 100 to 400 Angstroms via LPCVD or via plasma enhanced chemical vapor deposition (PECVD) procedures.

Figure 1:
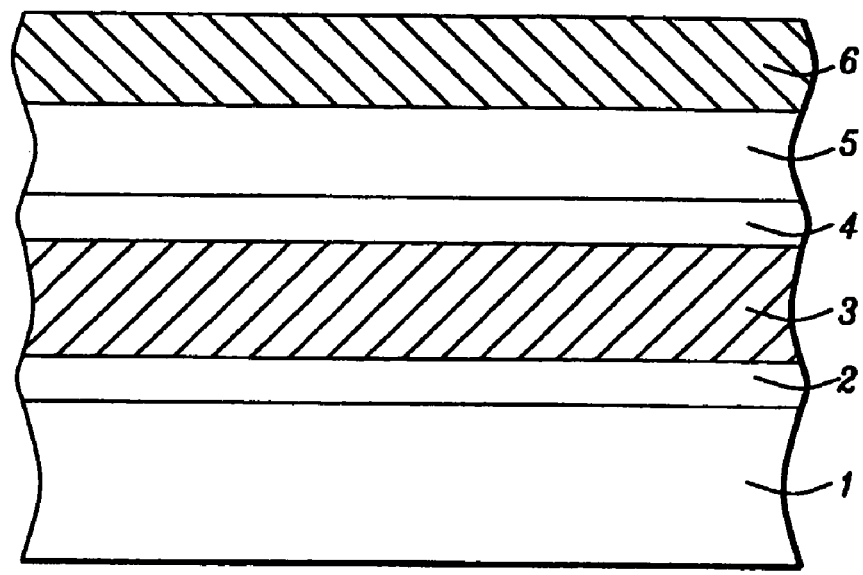
FIGS. 1-6, which schematically in cross-sectional style, describe key stages used to define a MOSFET polysilicon gate structure wherein a dual ARC coating, used to enhance dimension control of the polysilicon gate structure, is removed without the use of hot phosphoric acid.

To improve the ability to define the critical dimension in polysilicon needed for gate width control, anti-coating reflective (ARC), layers can be included as underlying or overlying component layers in a photoresist stack. The ARC layers minimize unwanted spreading phenomena that can occur during photoresist exposure procedures thus increasing the ability to obtain sharper images of the photoresist stack used as the mask for the polysilicon gate structure definition. Organic, bottom ARC (BARC) layers have been used to accomplish this objective, however to further optimize the critical polysilicon width dimension, dual ARC coatings comprised of both an underlying dielectric ARC (DARC) layer and the overlying organic BARC layer can also be used as components of the photolithographic procedure. The DARC layer can be a silicon oxynitride (SiON) layer or a silicon nitride layer. Dielectric layer 5, employed in this current embodiment is a SiON layer obtained at a thickness between about 200 to 600 Angstroms, via PECVD procedures. Organic bottom anti-reflective coating (BARC) layer 6, is next applied at a thickness between about 500 to 1200 Angstroms. The result of these depositions and applications are schematically shown in FIG. 1.

Figure 2:
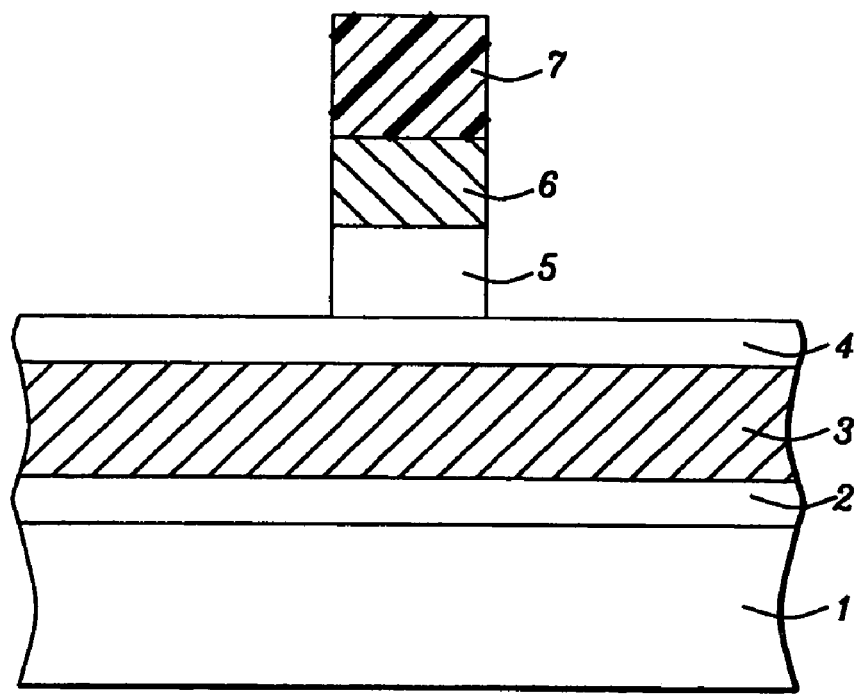

Photoresist shape 7, is next formed via application of a photoresist layer, exposure of the photoresist layer and development or removal of exposed regions of the photoresist layer via alkaline developer solutions. The presence of the dual ARC layers, organic BARC layer 6 and DARC layer 5, reduces unwanted scatter during the exposure cycle resulting in a desired image of photoresist shape 7, between about 1500 to 4000 Angstroms, after the development cycle. The exposed portions of BARC layer 6, are next removed via an anisotropic dry etching procedure such as a RIE procedure, using a chemistry comprised with either $CF_4$, HBR, $O_2$, $CHF_3$, or $CH_2F_2$ as an etchant for organic BARC layer 6. The anisotropic RIE procedure is continued to remove or trim exposed portions of DARC layer 5, using a fluorine based chemistry such as $CHF_3$, $CF_4$, $CH_3F$, or $CH_2F_2$ as an etchant, resulting in a stack comprised of photoresist shape 7, organic BARC shape 6, and dielectric DARC shape 5, overlying capping silicon oxide layer 4. This is schematically shown in FIG. 2.

Figure 3:
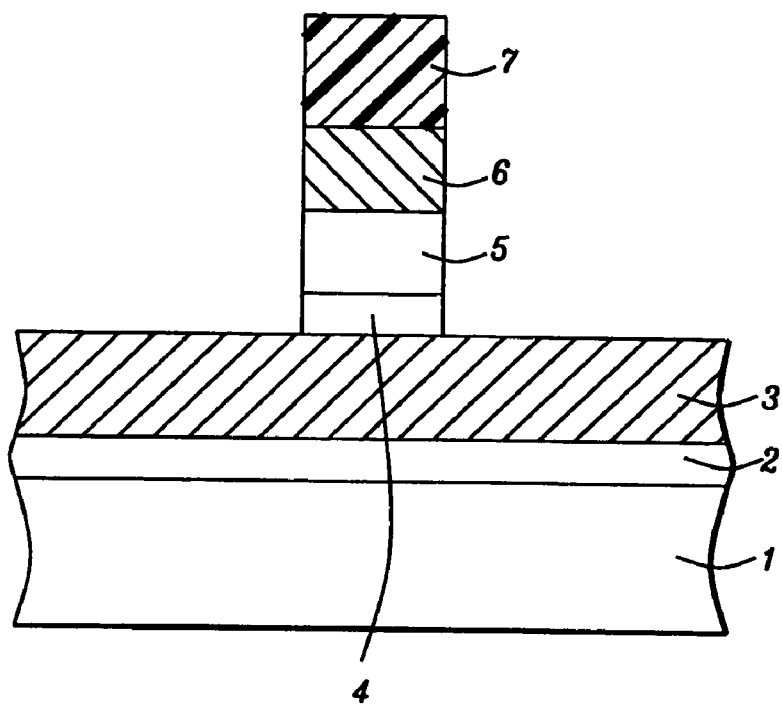

Trimming of silicon oxide layer capping layer 4, is next addressed via continuation of the anisotropic RIE procedure, again using either $CHF_3$, $CF_4$, $CH_3F$, or $CH_2F_2$ as a selective etchant for silicon oxide, using photoresist shape as the etch mask. This is shown schematically in FIG. 3.

Figure 4:
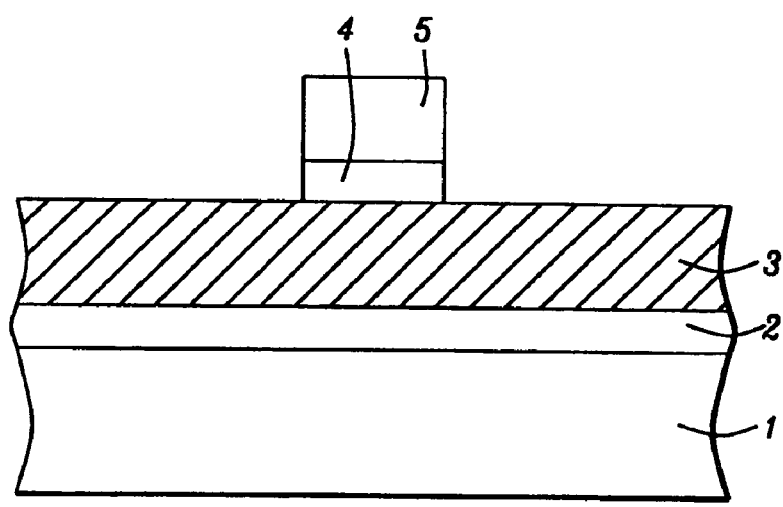

Transfer of the critical dimension in photoresist shape 7, to underlying DARC layer 5, allows removal of photoresist shape to now be performed. This is accomplished via plasma oxygen ashing and follow-up wet strip procedures for removal of photoresist shape 7. The process used to remove photoresist shape 7 also results in removal of organic BARC layer 6, resulting in an etch mask stack now comprised of DARC shape 5, and underlying silicon oxide capping shape 4, on blanket polysilicon layer 3. The result of the photoresist and organic BARC removal procedure is schematically displayed in FIG. 4. The present stack, comprised with the identical critical dimension previously defined in photoresist layer 7, will be used as an etch mask to pattern or define the desired narrow width, MOSFET polysilicon gate structure.

Figure 5:
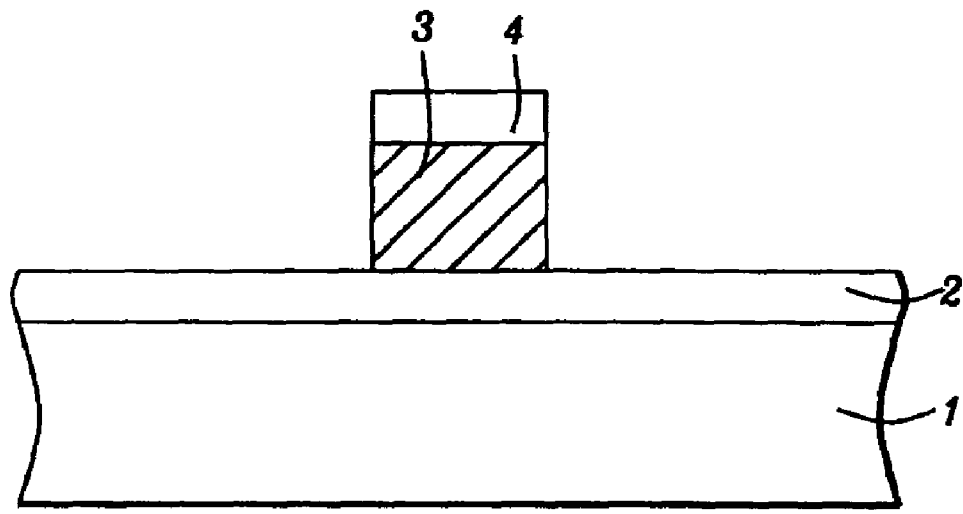

Another anisotropic RIE procedure using a chemistry comprised of $Cl_2$, $CF_4$, HBr, and $O_2$ as etchants for polysilicon layer 3, is next performed resulting in polysilicon gate structure 3. The anisotropic RIE procedure also results in the removal of dielectric DARC shape 5, with the selectivity, or the high etch rate ratio of DARC or polysilicon to silicon oxide, allowing the RIE procedure to terminate at the appearance of the top surface of silicon dioxide gate insulator layer 2, as well as terminating at the appearance of capping silicon oxide shape 4, allowing capping silicon oxide shape 4 to perform as an etch mask to transfer the critical dimension in the polysilicon layer. This is schematically shown in FIG. 5. The employment of a dry etch procedure for removal of DARC shape 5 can be used to limit the use of a hot phosphoric acid for DARC removal. The cleaner dry etch procedure avoids the particles encountered in hot phosphoric acid procedures and thus eliminates possible MOSFET yield loss resulting from particle contamination.

Figure 6:
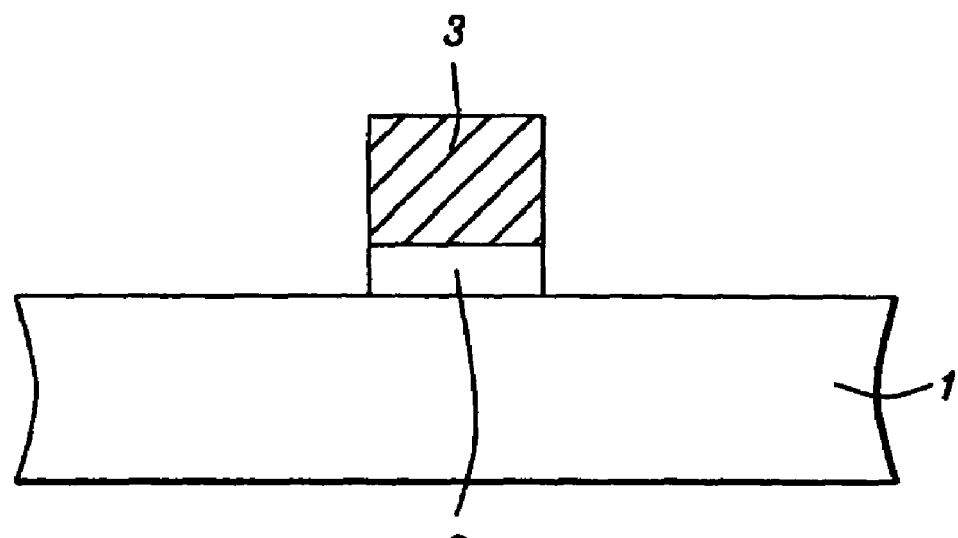

A hydrofluoric acid type procedure, either a dilute hydrofluoric (DHF) or a buffered hydrofluoric (BHF) wet procedure, is then applied to remove portions of silicon dioxide gate insulator layer not covered by polysilicon gate structure 3. Capping silicon oxide shape 4 is also selectively removed during this procedure resulting in polysilicon gate structure 3 on underlying silicon dioxide gate insulator layer 2, with the desired critical dimension for the polysilicon gate structure successfully transferred via use of a dielectric DARC layer. The DARC layer can be removed via an integrated transfer procedure accomplished without the use of a contaminating hot phosphoric acid bath. This is schematically shown in FIG. 6

Other embodiments of this invention feature definition of a stack comprised of photoresist shape 7, BARC shape 6, and DARC shape 5, followed by an oxygen ashing procedure removing both photoresist shape 7 and organic BARC shape 6, leaving DARC shape 5 as an etch mask for anisotropic etching or trimming of capping silicon oxide layer 4. The definition of polysilicon gate structure 3 is again accomplished via dry etching procedures wherein DARC shape 5 is again removed during the dry etch procedure, again avoiding the use of hot phosphoric acid.

While this invention has been particularly shown and described with reference to the preferred embodiments thereof, it will be understood by those skilled in the art that various changes in form and details may be made without departing from the spirit and scope of this invention.

What is claimed is:

1. A method of defining a patterned, conductive gate structure for a metal oxide semiconductor field effect transistor (MOSFET) device on a semiconductor substrate, comprising the steps of:
    forming a conductive layer over the semiconductor substrate;
    forming a capping insulator layer over said conductive layer;
    forming an anti-reflective coating (ARC) layer over said capping insulator layer;
    forming a patterned photoresist shape on said ARC layer;
    performing a first dry etch using said photoresist shape as an etch mask and using a first etchant to define a stack comprised of an ARC shape and a capping insulator shape;
    performing a second dry etch using said capping insulator shape as an etch mask and using a second etchant to define a patterned conductive gate structure in the conductive layer and to remove said ARC shape.

2. The method of claim 1, wherein said ARC layer is a silicon nitride dielectric ARC.

3. The method of claim 1, wherein said ARC layer is directly over the capping layer.

4. The method of claim 1, wherein said conductive layer is a polysilicon layer.

5. The method of claim 1, wherein said conductive layer is a metal silicide layer such as a tungsten silicide layer.

6. The method of claim 1, wherein said capping insulator layer is a silicon oxide layer.

7. The method of claim 1, wherein said ARC layer is a silicon oxynitride layer.

8. The method of claim 1, wherein said ARC layer includes an organic bottom anti-reflective coating (BARC).

9. The method of claim 1, wherein said first dry etch includes an anisotropic reactive ion etch (RIE) performed using $CF_4$, $CHF_3$, $CH_2F_2$, HBR, $O_2$ or $N_2$ as the first etchants.

10. The method of claim 1, wherein said first dry etch includes an anisotropic reactive ion etch (RIE) performed using a fluorine based chemistry comprised with either $CHF_3$, $CH_3F$, $CH_2F_2$, and/or $CF_4$ as the first etchants.

11. The method of claim 1, wherein said second dry etch includes an anisotropic reactive ion etch (RIE) using an etch chemistry comprised of $Cl_2$, HBR, or $CF_4$ as the second etchants.

12. The method of claim 1, further comprising
forming a gate insulator layer over the semiconductor substrate and underlying the conductive layer, before the forming of the conductive layer; and
performing a wet etch to remove portions of said gate insulator layer not covered by said patterned conductive gate structure and to remove said capping insulator shape.

13. The method of claim 12 wherein said wet etch includes using one of a dilute hydrofluoric (DHF) and a buffered hydrofluoric (BHF) acid solution.

* * * * *

UNITED STATES PATENT AND TRADEMARK OFFICE
CERTIFICATE OF CORRECTION

| | | |
|---|---|---|
| PATENT NO. | : 7,307,009 B2 | Page 1 of 1 |
| APPLICATION NO. | : 10/999270 | |
| DATED | : December 11, 2007 | |
| INVENTOR(S) | : Li-Te S. Lin et al. | |

It is certified that error appears in the above-identified patent and that said Letters Patent is hereby corrected as shown below:

Column 4, lines 47-48 Claim 5 should be corrected from:

"5. The method of claim 1, wherein said conductive layer is a metal silicide layer such as a tungsten silicide layer."

to:

--5. The method of claim 1, wherein said conductive layer is a metal silicide layer.--

Signed and Sealed this

Twenty-seventh Day of May, 2008

JON W. DUDAS
*Director of the United States Patent and Trademark Office*